United States Patent
Park et al.

(10) Patent No.: US 10,333,025 B1
(45) Date of Patent: Jun. 25, 2019

(54) ULTRAVIOLET LIGHT EMITTING DEVICES HAVING A DIELECTRIC LAYER AND A TRANSPARENT ELECTRODE LAYER DISPOSED IN BETWEEN PATTERNED NITRIDE SEMICONDUCTOR LAYERS

(71) Applicant: Samsung Electronics Co., Ltd., Suwon-si, Gyeonggi-do (KR)

(72) Inventors: Young Hwan Park, Yongin-si (KR); Mi Hyun Kim, Seoul (KR); Joo Sung Kim, Seongnam-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/012,831

(22) Filed: Jun. 20, 2018

(30) Foreign Application Priority Data

Dec. 19, 2017 (KR) .......................... 10-2017-0175149

(51) Int. Cl.
  *H01L 33/00* (2010.01)
  *H01L 33/06* (2010.01)
  (Continued)

(52) U.S. Cl.
  CPC .......... *H01L 33/06* (2013.01); *H01L 33/0025* (2013.01); *H01L 33/0075* (2013.01);
  (Continued)

(58) Field of Classification Search
  CPC ... H01L 33/06; H01L 33/0075; H01L 33/145; H01L 33/32; H01L 33/405; H01L 33/42
  See application file for complete search history.

(56) References Cited

U.S. PATENT DOCUMENTS 6,372,608 B1  4/2002  Shimoda et al.
6,645,830 B2  11/2003  Shimoda et al.
(Continued)

FOREIGN PATENT DOCUMENTS

EP          1071143 A1 *  1/2001 .......... H01L 33/007
KR     2015-0017543 A     2/2015

OTHER PUBLICATIONS

US 9,728,677 B2, 08/2017, Kashima et al. (withdrawn)

*Primary Examiner* — Ermias T Woldegeorgis
(74) *Attorney, Agent, or Firm* — Lee & Morse, P.C.

(57) ABSTRACT

An ultraviolet light emitting device including a first conductivity-type AlGaN semiconductor layer; an active layer disposed on the first conductivity-type AlGaN semiconductor layer and having an AlGaN semiconductor; a second conductivity-type AlGaN semiconductor layer disposed on the active layer and having an upper surface divided into a first region and a second region; second conductivity-type nitride patterns disposed on the first region of the second conductivity-type AlGaN semiconductor layer and having an energy band gap that is smaller than an energy band gap of the second conductivity-type AlGaN semiconductor layer; a transparent electrode layer covering the second conductivity-type nitride patterns and the second region of the second conductivity-type AlGaN semiconductor layer; a light-transmissive dielectric layer disposed on the transparent electrode layer between the second conductivity-type nitride patterns; and a metal electrode disposed on the transparent electrode layer overlying the second conductivity type nitride patterns and on the light-transmissive dielectric layer.

20 Claims, 10 Drawing Sheets

(51) Int. Cl.
  *H01L 33/32* (2010.01)
  *H01L 33/24* (2010.01)
  *H01L 33/42* (2010.01)
  *H01L 33/44* (2010.01)
  *H01L 33/40* (2010.01)
  *H01L 33/14* (2010.01)

(52) U.S. Cl.
  CPC ............ *H01L 33/145* (2013.01); *H01L 33/24* (2013.01); *H01L 33/32* (2013.01); *H01L 33/405* (2013.01); *H01L 33/42* (2013.01); *H01L 33/44* (2013.01); *H01L 2933/0016* (2013.01); *H01L 2933/0025* (2013.01)

(56) References Cited

U.S. PATENT DOCUMENTS

| | | |
|---|---|---|
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,943,377 B2 | 9/2005 | Gaska et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,395,176 B2 * | 3/2013 | Seong .................. H01L 33/387 257/99 |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,754,430 B2 * | 6/2014 | Kim ....................... H01L 33/04 257/194 |
| 8,766,295 B2 | 7/2014 | Kim |
| 8,822,976 B2 | 9/2014 | Inazu et al. |
| 9,070,847 B2 | 6/2015 | Noguchi et al. |
| 9,112,115 B2 | 8/2015 | Inazu et al. |
| 9,190,557 B2 | 11/2015 | Zhong et al. |
| 9,331,246 B2 | 5/2016 | Kneissl et al. |
| 2007/0101932 A1 * | 5/2007 | Schowalter ........... C30B 11/003 117/84 |
| 2010/0032647 A1 * | 2/2010 | Khan .................. H01L 21/0242 257/13 |
| 2010/0219395 A1 * | 9/2010 | Hirayama ............... H01L 33/06 257/13 |
| 2013/0207147 A1 | 8/2013 | Nam et al. |
| 2014/0183546 A1 | 7/2014 | Kim et al. |

* cited by examiner

ULTRAVIOLET LIGHT EMITTING DEVICES HAVING A DIELECTRIC LAYER AND A TRANSPARENT ELECTRODE LAYER DISPOSED IN BETWEEN PATTERNED NITRIDE SEMICONDUCTOR LAYERS

CROSS-REFERENCE TO RELATED APPLICATION

Korean Patent Application No. 10-2017-0175149 filed on Dec. 19, 2017 in the Korean Intellectual Property Office, and entitled: "Ultraviolet Light Emitting Devices," is incorporated by reference herein in its entirety.

BACKGROUND

1. Field

Embodiments relate to an ultraviolet light emitting device.

2. Description of the Related Art

Recently, ultraviolet light sources have been employed in devices such as sterilizers, disinfection devices, UV curing devices and the like for various purposes. As ultraviolet light sources, environmentally friendly semiconductor light-emitting diodes (LED) having high efficiency characteristics have received considerable attention. For example, nitride semiconductor light-emitting diodes have been considered.

SUMMARY

The embodiments may be realized by providing an ultraviolet light emitting device including a first conductivity-type AlGaN semiconductor layer; an active layer disposed on the first conductivity-type AlGaN semiconductor layer and having an AlGaN semiconductor; a second conductivity-type AlGaN semiconductor layer disposed on the active layer and having an upper surface divided into a first region and a second region; second conductivity-type nitride patterns disposed on the first region of the second conductivity-type AlGaN semiconductor layer and having an energy band gap that is smaller than an energy band gap of the second conductivity-type AlGaN semiconductor layer; a transparent electrode layer covering the second conductivity-type nitride patterns and the second region of the second conductivity-type AlGaN semiconductor layer; a light-transmissive dielectric layer disposed on the transparent electrode layer between the second conductivity-type nitride patterns; and a metal electrode disposed on the transparent electrode layer overlying the second conductivity type nitride patterns and on the light-transmissive dielectric layer.

The embodiments may be realized by providing an ultraviolet light emitting device including a light-emitting laminate including a first conductivity-type semiconductor layer including a $Al_{x1}Ga_{1-x1}N$ semiconductor, in which $0<x1<1$, a second conductivity-type semiconductor layer including a $Al_{x2}Ga_{1-x2}N$ semiconductor, in which $0<x2<1$, and an active layer disposed between the first and second conductivity-type semiconductor layers and including a $Al_{x3}Ga_{1-x3}N$ semiconductor, in which $0<x3<x1$ and $0<x3<x2$; second conductivity-type nitride patterns partially disposed on the second conductivity-type semiconductor layer and including a $Al_{x4}Ga_{1-x4}N$ semiconductor, in which $0<x4<x2$; a transparent electrode layer disposed on upper surfaces of the second conductivity-type nitride patterns; a light-transmissive dielectric layer disposed on a region of the second conductivity-type semiconductor layer that is between the second conductivity-type nitride patterns; and a metal electrode disposed on the transparent electrode layer and the light-transmissive dielectric layer.

The embodiments may be realized by providing an ultraviolet light emitting device including a first conductivity-type AlGaN semiconductor layer; an active layer disposed on the first conductivity-type AlGaN semiconductor layer and having an AlGaN semiconductor; a second conductivity-type AlGaN semiconductor layer disposed on the active layer and having an upper surface divided into a first region and a second region; second conductivity-type nitride patterns partially formed on the second conductivity-type semiconductor layer and including a GaN semiconductor; an ITO layer disposed at least on upper surfaces of the second conductivity-type nitride patterns; a light-transmissive dielectric layer disposed on the second conductivity-type semiconductor layer between the second conductivity-type nitride patterns; and a metal electrode disposed on regions of the transparent electrode layer overlying the second conductivity type nitride patterns and on the light-transmissive dielectric layer.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
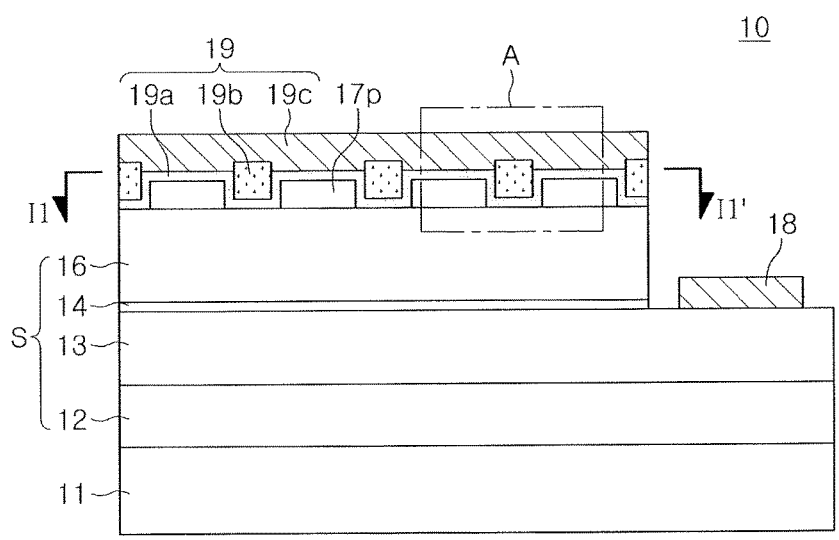
FIG. 1 illustrates a side cross-sectional view of an ultraviolet light emitting device according to an example embodiment
Figure 2:
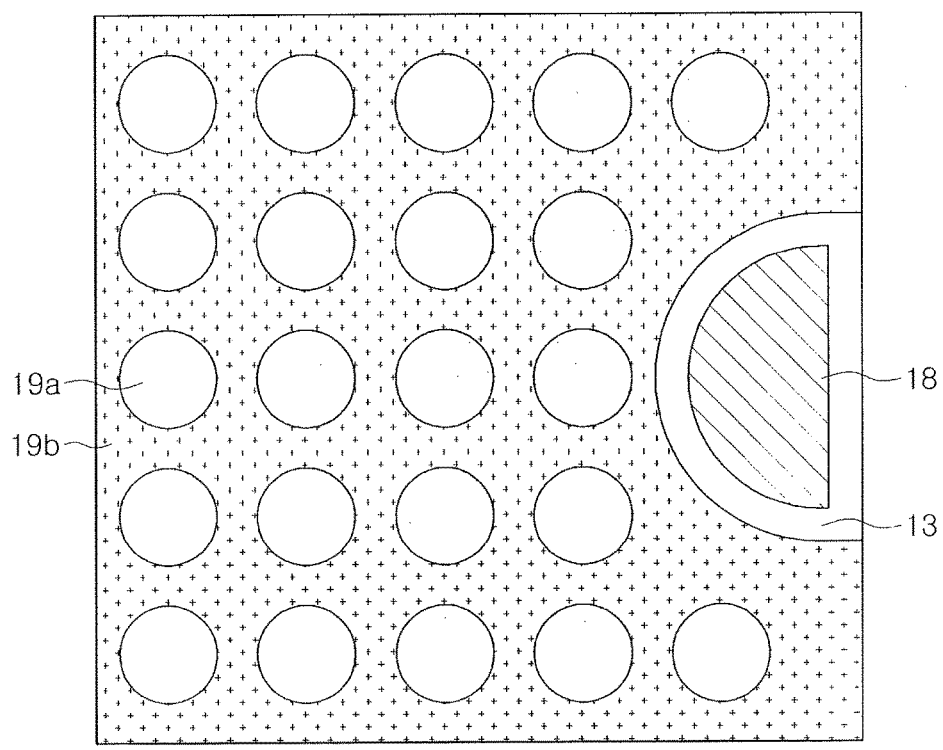
FIG. 2 illustrates a top plan view of the ultraviolet light emitting device shown in FIG. 1.

FIG. 1 illustrates a side cross-sectional view of an ultraviolet light emitting device according to an example embodiment. FIG. 2 illustrates a top plan view taken along line I1-I1' of the ultraviolet light emitting device shown in FIG. 1.

Referring to FIGS. 1 and 2, an ultraviolet light emitting device 10 according to the example embodiment may include a substrate 11 and a semiconductor laminate S disposed on the substrate 11 for emission of ultraviolet light. The semiconductor laminate S may include a first conductivity-type semiconductor layer 13 and a second conductivity-type semiconductor layer 16, and an active layer 14 disposed between the first and second conductivity-type semiconductor layers 13 and 16.

The substrate 11 may be an insulating, conductive, or semiconductor substrate. For example, the substrate 11 may include sapphire, AlN, SiC, $MgAl_2O_4$, MgO, $LiAlO_2$, or $LiGaO_2$. As used herein, the term "or" is not an exclusive term. The semiconductor laminate S employed in the embodiment may include a base layer 12 formed on the substrate 11 and provided for the growth of the first conductivity-type AlGaN semiconductor layer. For example, the base layer 12 may be formed of a nitride such as AlN or AlGaN.

In an implementation, the first conductivity-type semiconductor layer 13 may include, e.g., an n-type nitride semiconductor represented by $Al_{x1}Ga_{1-x1}N$, in which $0<x1\leq1$, and an n-type impurity may be silicon (Si). For example, the first conductivity-type semiconductor layer 13 may contain n-type AlGaN. In an implementation, the second conductivity-type semiconductor layer 16 may include, e.g., a p-type nitride semiconductor represented by $Al_{x2}Ga_{1-x2}N$, in which $0<x2\leq1$, and a p-type impurity may be Mg. For example, the second conductivity-type semiconductor layer 16 may contain p-type AlGaN.

In an implementation, an Al composition ratio x1 of the first conductivity-type semiconductor layer 13 may be in a range of 0.45 to 0.99, e.g., may be in the range of 0.60 to 0.65. In an implementation, an Al composition ratio x2 of the second conductivity-type semiconductor layer 16 may be in a range of 0.45 to 0.99, e.g., may be in the range of 0.75 to 0.85.

The active layer 14 employed in the embodiment may have a quantum well formed of $Al_{x3}Ga_{1-x3}N$, in which $0<x3<1$. In an implementation, the active layer 14 may have, e.g., a single quantum well (SQW) structure having a single quantum well. In an implementation, the active layer 14 may have a multiple quantum well (MQW) structure in which a plurality of quantum well layers and a plurality of quantum barrier layers are alternately stacked (see FIG. 4).

The quantum well of the active layer 14 may have a band gap that determines a wavelength of ultraviolet light, and the active layer 14 employed in this embodiment may be configured to emit light having a wavelength of 210 nm to 315 nm. The first and second conductivity-type semiconductor layers 13 and 16 may have a band gap that is greater than the band gap of the quantum well so that ultraviolet light generated from the active layer 14 is not absorbed thereby. In an implementation, an Al composition ratio x3 of the quantum well may be smaller than the Al composition ratios x1 and x2 of the first and second conductivity-type semiconductor layers 13, 16. In an implementation, the Al composition ratio x3 of the quantum well may range from 0.35 to 0.5.

The ultraviolet light emitting device 10 according to the embodiment may include a first electrode 18 and a second electrode 19 connected to the first and second conductivity-type semiconductor layers 13 and 16, respectively.

As illustrated in FIG. 1, the semiconductor laminate S may have an area exposing one region of the first conductivity-type semiconductor layer 13 by partially removing the second conductivity-type semiconductor layer 16 and the active layer 14. The first electrode 18 may be disposed on the exposed region of the first conductivity-type semiconductor layer 13. The first electrode 18 may be an n-electrode, may be formed of Al, Ti, Ni, Cr, Au, Ag, or ITO, or may be a multilayer structure configured of the composition thereof.

The second electrode 19 employed in the embodiment may be provided not only as an ohmic-contact structure but may also be provided as an omnidirectional reflector (ODR) for improving light extraction efficiency.

The second electrode 19 employed in this embodiment may provide a reflective structure for improving light extraction efficiency. In an ultraviolet light emitting device, it may be difficult to obtain desired reflectivity with a reflective electrode of a blue light-emitting diode. For example, the reflectivity of most reflective metals may be much lower than that of other visible light such as blue light.

For example, in the case of silver (Ag), an ohmic-contact material having very high reflectivity in blue light, the reflectivity of ultraviolet light is as low as 20%. On the other hand, in the case of a metal (e.g., aluminum) having higher reflectivity than blue light, it may be difficult to form an ohmic-contact with the second conductivity-type semiconductor layer 16. For example, a second conductivity-type semiconductor layer (e.g., a p-type AlGaN layer) may have considerable contact resistance with the electrode, and it may be necessary to lower the Al composition ratio or replace it with the p-type GaN in order to form the ohmic-contact. However, if the Al composition ratio of a second conductivity-type semiconductor layer were to be lowered, the ultraviolet light may be absorbed, so that the light efficiency may be lowered.

In an implementation, second conductivity-type nitride patterns 17p (having an energy band gap that is smaller than the energy band gap of the second conductivity-type semiconductor layer 16) may be formed on some regions of the second conductivity-type semiconductor layer 16 (e.g., may be discontinuously formed on the second conductivity-type semiconductor layer 16). When the second conductivity-type nitride patterns 17p are represented by or include p-type $Al_{x4}Ga_{1-x4}N$, an Al composition ratio x4 may be lower than the Al composition ratio x2 of the second conductivity-type semiconductor layer 16. In an implementation, the second conductivity-type nitride patterns 17p may be formed of p-type GaN. The second conductivity-type nitride patterns 17p may only be formed on some regions of the second conductivity-type semiconductor layer 16. In an implementation, as shown in FIG. 2, the second conductivity-type nitride patterns 17p may be formed as a plurality of circular patterns (e.g., rounded, island shaped patterns). In an implementation, the second conductivity-type nitride patterns 17p may be formed in various other shapes of patterns and/or arrangements.

A transparent electrode layer 19a formed on the regions in which the second conductivity-type nitride patterns 17p are formed (e.g., formed on the second conductivity-type nitride patterns 17p) may be provided as an ohmic-contact structure. The transparent electrode layer 19a employed in this embodiment may also be disposed on another region of the second conductivity-type semiconductor layer 16, e.g., in a region in which no second conductivity-type nitride pattern 17p is formed, while covering the second conductivity-type nitride patterns 17p. For example, the transparent electrode layer 19a may be on the second conductivity-type nitride patterns 17p and on portions of the second conductivity-type semiconductor layer 16 exposed between the second conductivity-type nitride patterns 17p.

In an implementation, the second conductivity-type nitride patterns 17p may be formed of p-type GaN, and the transparent electrode layer 19a may be an ITO layer. In an implementation, the transparent electrode layer 19a may be advantageously used for a transparent electrode material having light transmittance while forming an ohmic-contact with the second conductivity-type nitride patterns 17p. In an implementation, the transparent electrode layer 19a may include ITO, and the transparent electrode layer 10 may have a thickness of 1 nm to 50 nm.

In an implementation, the transparent electrode layer 19a may include, e.g., ITO (Indium Tin Oxide), ZITO (Zinc-doped Indium Tin Oxide), ZIO (Zinc Indium Oxide), GIO (Gallium Indium Oxide), ZTO (Zinc Tin Oxide), FTO (Fluorine-doped Tin Oxide), AZO (Aluminum-doped Zinc Oxide), GZO (Gallium-doped Zinc Oxide), $In_4Sn_3O_{12}$, or $Zn_{(1-x)}Mg_xO$ (Zinc Magnesium Oxide, in which $0 \leq x \leq 1$).

The second conductivity-type nitride patterns 17p (having a relatively small band gap) may be formed on some regions of the second conductivity-type semiconductor layer 16, and light extraction efficiency may be adversely affected. However, in order to complement such a limitation, an omnidirectional reflector (ODR) having high reflectivity may be formed in another region of the second conductivity-type semiconductor layer 16, e.g., the region in which no second conductivity-type nitride pattern 17p is formed (e.g., between the second conductivity-type nitride patterns 17p).

A light-transmissive dielectric layer 19b may be formed in the region in which no second conductivity-type nitride pattern 17p is formed. The light-transmissive dielectric layer 19b may have a low refractive index (e.g., 2 or less). In an implementation, the light-transmissive dielectric layer 19b may include $SiO_2$, SiN, $TiO_2$, HfO, or $MgF_2$.

A metal electrode 19c may be formed on the light-transmissive dielectric layer 19b. The metal electrode 19c employed in this embodiment may not only be formed on a surface of the light-transmissive dielectric layer 19b but also on the transparent electrode layer 19a. The metal electrode 19c may be combined with the light-transmissive dielectric layer 19b, a low refractive layer, and may serve as an omnidirectional reflector to thereby supply current to the transparent electrode layer 19a. In an implementation, the metal electrode 19c may include, e.g., Al, Rh, or Ru.

Figure 3:
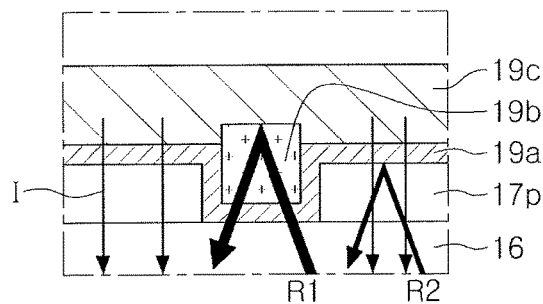
FIG. 3 illustrates an enlarged view of a portion A of the ultraviolet light emitting device shown in FIG. 1.

As such, the second electrode 19 according to the embodiment may be provided as an omnidirectional reflector as well as an ohmic-contact structure. As shown in FIG. 3, a main current flow I may be formed through the second conductivity-type nitride patterns 17p and the transparent electrode layer 19a, and ultraviolet light R2 traveling in the same region may be absorbed by the second conductivity-type nitride patterns 17p and may have low reflectivity, while ultraviolet light R1 traveling from the light-transmissive dielectric layer 19b to the metal electrode 19c has high reflectivity due to the ODR structure.

In an implementation, as illustrated in FIG. 2, an ohmic-contact structure realized by a combination of the second conductivity-type nitride pattern 17p and the transparent electrode layer 19a may be formed in a form in which it is widely dispersed on an upper surface (e.g., surface that faces away from the active layer 14) of the second conductivity-type semiconductor layer 16, so that uniform current distribution may be achieved over the entire region of the active layer.

As described above, the second conductivity-type nitride patterns 17p may be formed in various shapes such as polygonal shapes, e.g., quadrangular shapes, or line shapes, as well as circular shapes. In an implementation, the second conductivity-type nitride patterns 17p may not be formed as embossed patterns as shown in FIG. 2, but second conductivity-type nitride patterns 17p' may be formed as engraved patterns, as shown in FIGS. 4 and 5 (e.g., in a continuous grid pattern).

Figure 4:
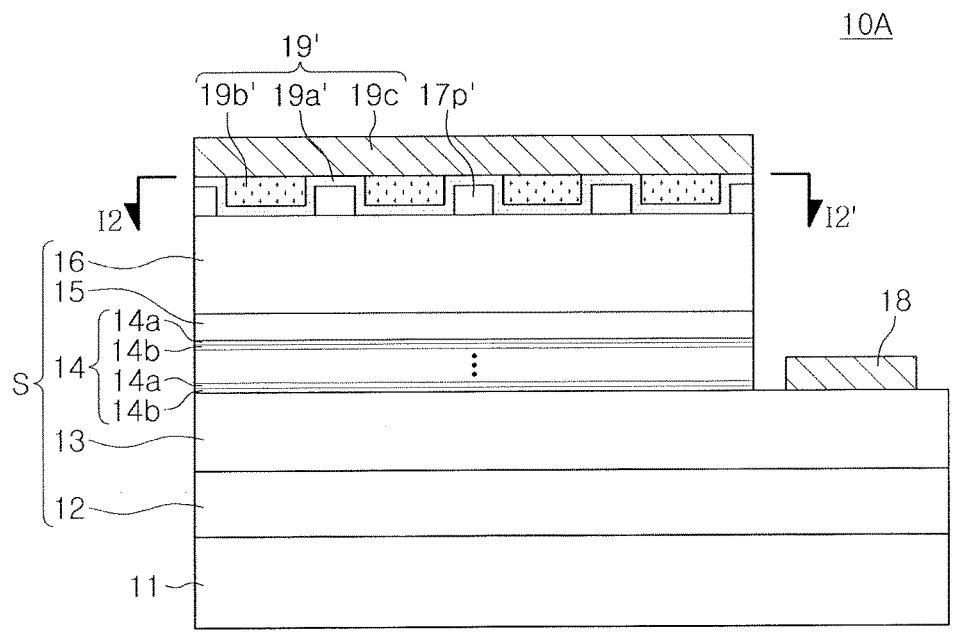
FIG. 4 illustrates a side cross-sectional view of an ultraviolet light emitting device according to an example embodiment.

FIG. 4 illustrates a side cross-sectional view of an ultraviolet light emitting device according an example embodiment. FIG. 5 illustrates a top plan view taken along line I2-I2' of the ultraviolet light emitting device shown in FIG. 4.

Figure 5:
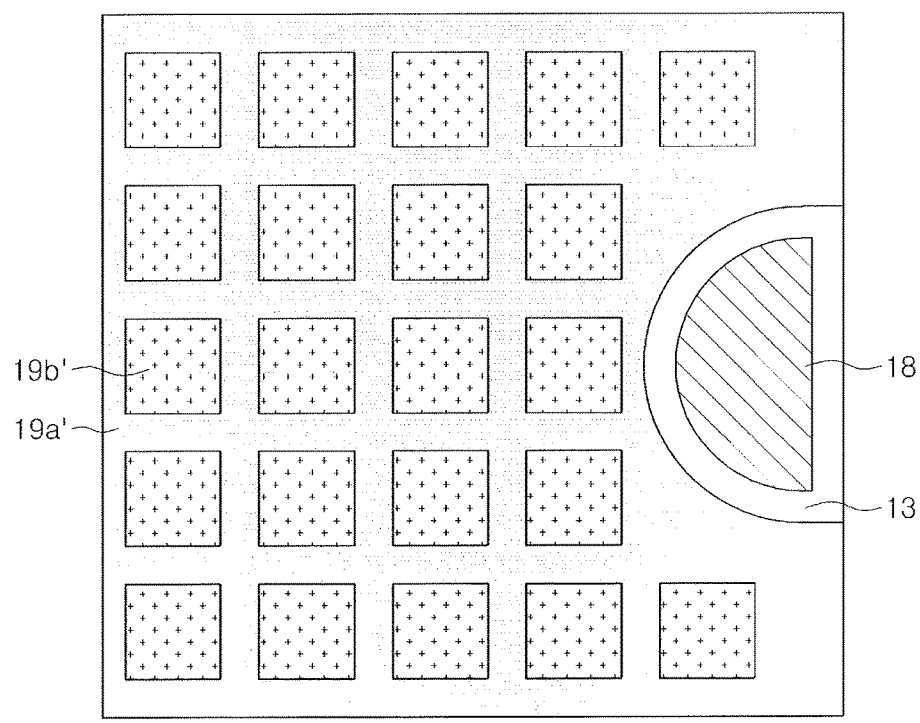
FIG. 5 illustrates a top plan view of the ultraviolet light emitting device shown in FIG. 4.

Referring to FIGS. 4 and 5, it may be understood that an ultraviolet light emitting device 10A according to the embodiment is similar to the ultraviolet light emitting device 10 shown in FIGS. 1 and 2, with the exception that a second electrode 19' and the active layer 14 have structures different from those shown in FIGS. 1 and 2 and an electron blocking layer is included in the ultraviolet light-emitting semiconductor device 10A. Descriptions of components of this embodiment may refer to the description of the same or similar components of the ultraviolet light emitting device 10 shown in FIGS. 1 and 2, unless otherwise specified.

The second conductivity-type nitride pattern 17p' may be formed to have an engraved pattern layer having a hole with a quadrangular planar surface or quadrangular shape. Similar to the previous embodiment, a transparent electrode layer 19a' (e.g., including ITO) may be formed on the upper surface of the second conductivity-type semiconductor layer 16 (e.g., in the hole or holes within the second conductivity-type nitride pattern 17p') and on the second conductivity-type nitride pattern 17p'. The light-transmissive dielectric layer 19b' may be formed in the region of the quadrangular hole (e.g., on the transparent electrode layer 19a'), and the metal electrode 19c may be formed on the transparent electrode layer 19a' and the light-transmissive dielectric layer 19b'.

The active layer 14 employed in the embodiment may have a multiple quantum well (MQW) structure in which a plurality of quantum well layers formed of $Al_{xa}Ga_{1-xa}N$ (in which $0<xa<1$) and a plurality of quantum barrier layers formed of $Al_{xb}Ga_{1-xb}N$ (in which $xa<xb<1$) are alternately stacked. The quantum well of the active layer 14 may have a band gap that determines a wavelength of ultraviolet light, and the active layer 14 employed in this embodiment may be configured to emit light having a wavelength of 210 nm to 315 nm. In an implementation, an Al composition ratio xa of the quantum well may be in a range of 0.40 to 1.0, and the Al composition ratio xa may be varied depending on a desired wavelength.

The semiconductor laminate S employed in the embodiment may further include an electron blocking layer (EBL) 15 disposed between the second conductivity-type semiconductor layer 16 and the active layer 14. The electron blocking layer 15 may have a band gap that is higher than that of the second conductivity-type semiconductor layer 16, and may include a p-type nitride semiconductor represented by $Al_{x5}Ga_{1-x5}N$ (in which $x2<x5 \leq 1$). In an implementation, an Al composition ratio X5 of the electron blocking layer 15 may be 0.8 or more.

FIG. 6A through FIG. 6F illustrate cross-sectional views of stages in a method of manufacturing the ultraviolet light emitting device according to an example embodiment.

Figure 6A:
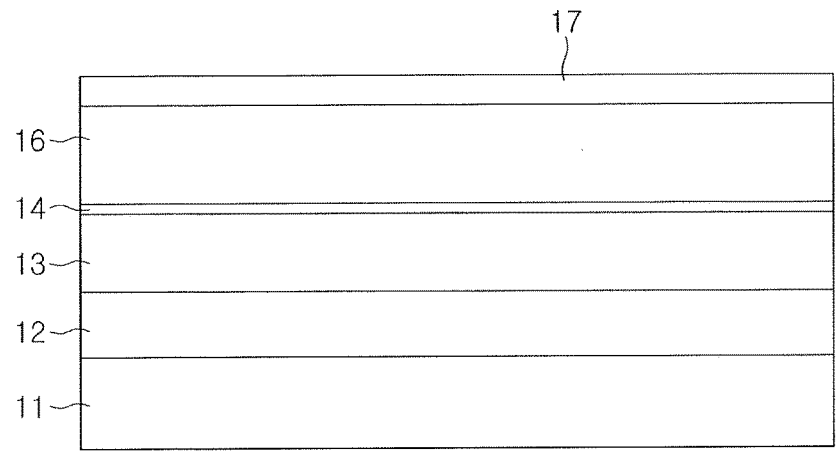
FIG. 6A through FIG. 6F illustrate cross-sectional views of stages in a method of manufacturing the ultraviolet light emitting device according to an example embodiment.

Referring to FIG. 6A, the base layer 12, the first conductivity-type semiconductor layer 13, the active layer 14, and the second conductivity-type semiconductor layer 16 may be sequentially stacked on the substrate 11 to form a semiconductor laminate for emission of ultraviolet light.

In addition, a second conductivity-type nitride layer 17 (having a relatively small band gap) may be formed on the second conductivity-type semiconductor layer 16. The second conductivity-type nitride layer 17 may be, e.g., an AlGaN layer or a GaN layer having an Al composition ratio smaller than the Al composition ratio of the second conductivity-type semiconductor layer 16. In an implementation, the substrate 11 may be formed of sapphire or AlN, as described above.

The first conductivity-type semiconductor layer 13 may be an n-type nitride semiconductor represented by $Al_{x1}$ Ga$_{1-x1}$N (in which 0<x1≤1), e.g., may contain n-type AlGaN. The second conductivity-type semiconductor layer 16 may be a p-type nitride semiconductor represented by Al$_{x2}$Ga$_{1-x2}$N (in which 0<x2≤1), e.g., may contain p-type AlGaN. In an implementation, the active layer 14 employed in the embodiment may have a quantum well formed of Al$_{x3}$Ga$_{1-x3}$N (in which 0<x3<1). In an implementation, the active layer 14 may be a multiple quantum well (MQW) structure.

The base layer 12, the first conductivity-type semiconductor layer 13, the active layer 14, and the second conductivity-type semiconductor layer 16 may be grown by, e.g., a metal organic chemical vapor deposition (MOCVD), hydride vapor phase epitaxy (HVPE) or MBE (Molecular Beam Epitaxy) process.

Figure 6B:
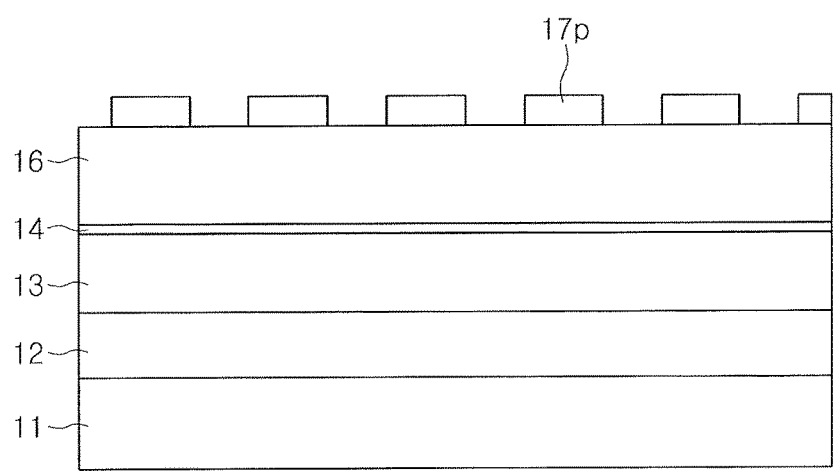

Next, referring to FIG. 6B, the second conductivity-type nitride layer 17 may be selectively etched to form the second conductivity-type nitride patterns 17p having a desired shape and arrangement.

The second conductivity-type nitride patterns 17p may only remain on some regions of the second conductivity-type semiconductor layer 16, and other regions of the second conductivity-type semiconductor layer 16 may be exposed to form an omnidirectional reflector ODR. In an implementation, as shown in FIG. 2, the second conductivity-type nitride patterns 17p may be formed as a plurality of circular patterns. In an implementation, the second conductivity-type nitride patterns 17p may be formed in various other shapes of patterns and/or arrangements. In an implementation, the process may be performed by a reactive ion etching (RIE) process using photolithography.

Figure 6C:
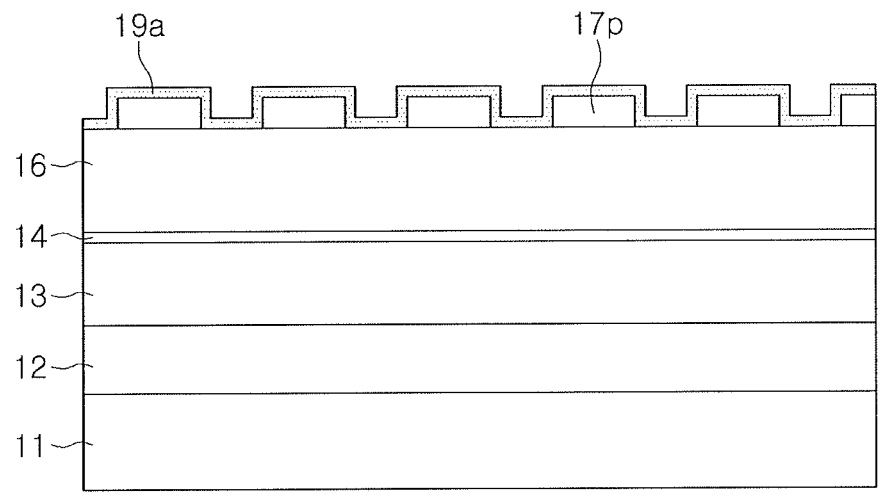

Next, referring to FIG. 6C, the transparent electrode layer 19a may be formed on the second conductivity-type semiconductor layer 16 so as to cover the second conductivity-type nitride patterns 17p.

The transparent electrode layer 19a may form an ohmic-contact with the second conductivity-type nitride patterns 17p. The transparent electrode layer 19a located between the second conductivity-type nitride patterns 17p may directly contact the second conductivity-type semiconductor layer 16, and thus, may have high contact resistance. In an implementation, the second conductivity-type nitride patterns 17p may be formed of p-type GaN, and the transparent electrode layer 19a may be an ITO layer. When the transparent electrode layer 19a is ITO, the transparent electrode layer 10 may be formed to have a thickness of 1 nm or more.

Figure 6D:
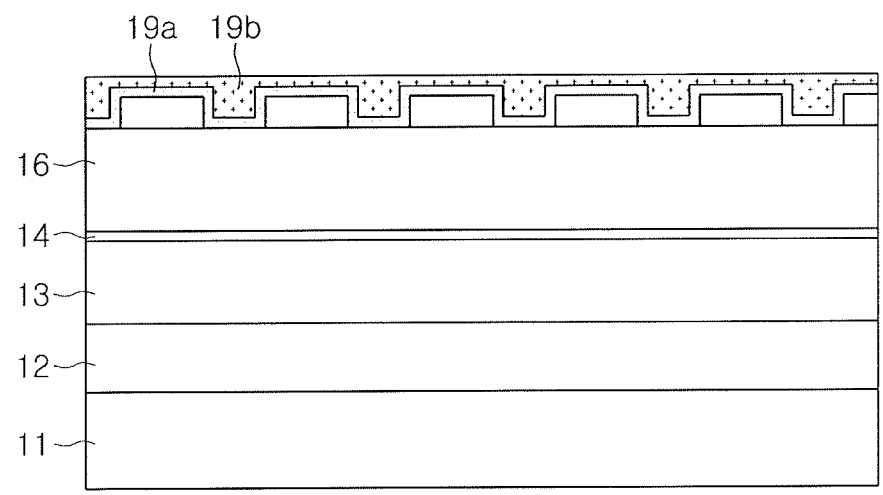
Figure 6E:
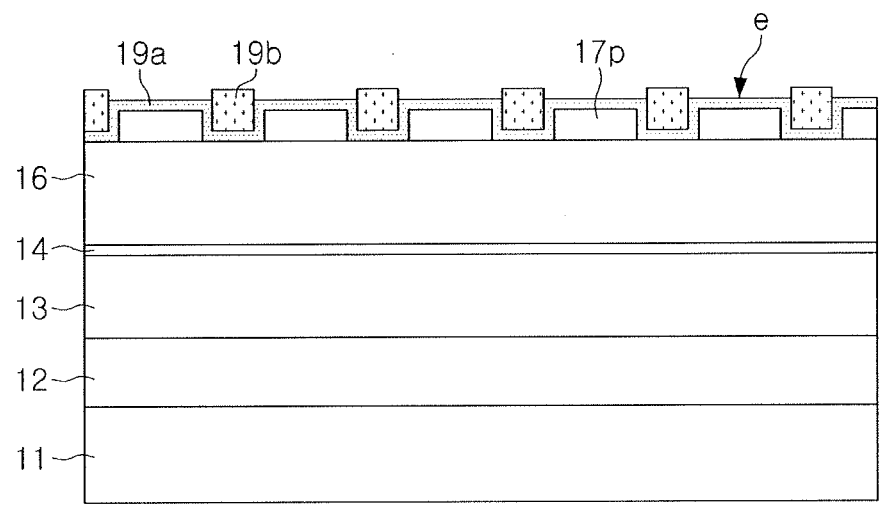

Next, referring to FIG. 6D, the light-transmissive dielectric layer 19b may be formed on the transparent electrode layer 19a so as to fill a space between the second conductivity-type nitride patterns 17p. As shown in FIG. 6E, the light-transmissive dielectric layer 19b may be selectively etched to expose regions e of the transparent electrode layer 19a corresponding to the second conductivity-type nitride patterns 17p.

The light-transmissive dielectric layer 19b may have a low refractive index (e.g., 2 or less). For example, the light-transmissive dielectric layer 19b may include SiO$_2$, SiN, TiO$_2$, HfO or MgF$_2$. The exposed region e of the transparent electrode layer 19a may be provided as a contact region with the metal electrode 19c to be formed in a subsequent process.

Figure 6F:
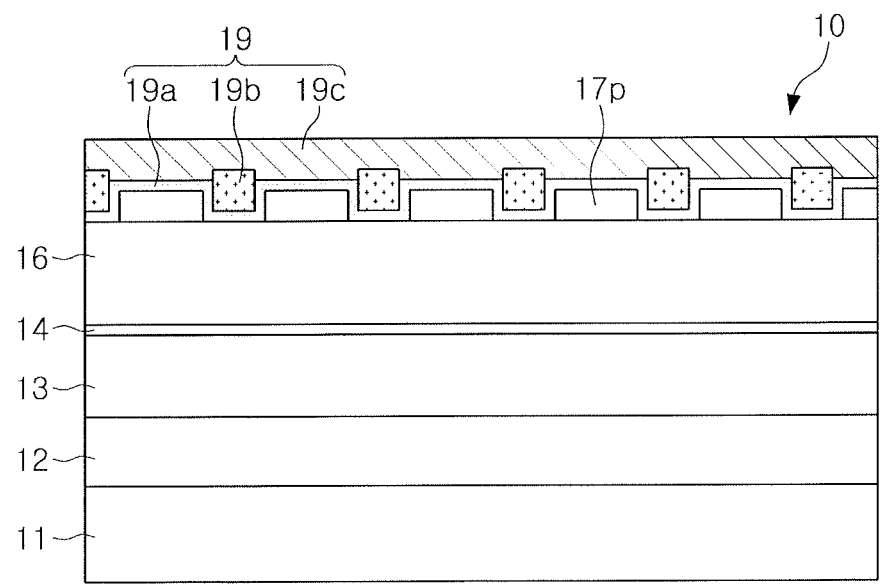

Next, referring to FIG. 6F, the metal electrode 19c may be formed on the exposed region e of the transparent electrode layer 19a and on the light-transmissive dielectric layer 19b.

The metal electrode 19c formed in this process may be formed on the light-transmissive dielectric layer 19b as well as on the exposed region e of the transparent electrode layer 19a. The metal electrode 19c may be provided as an omnidirectional reflector in combination with the light-transmissive dielectric layer 19b, e.g., a low refractive layer. In addition, the metal electrode 19c may be connected to the transparent electrode layer 19a and serve to supply current. In an implementation, the metal electrode 19c may include Al, Rh, or Ru.

In an implementation, the respective processes may be variously modified and performed. In an implementation, the transparent electrode layer 19a may be exposed (see FIG. 6E) by a selective etching process after the light-transmissive dielectric layer 19b is entirely deposited (see FIG. 6D). In an implementation, the transparent electrode layer 19a may be formed to only fill a region between the second conductivity-type nitride patterns 17p by using a mask in the deposition process of the light-transmissive dielectric layer 19b.

Figure 7:
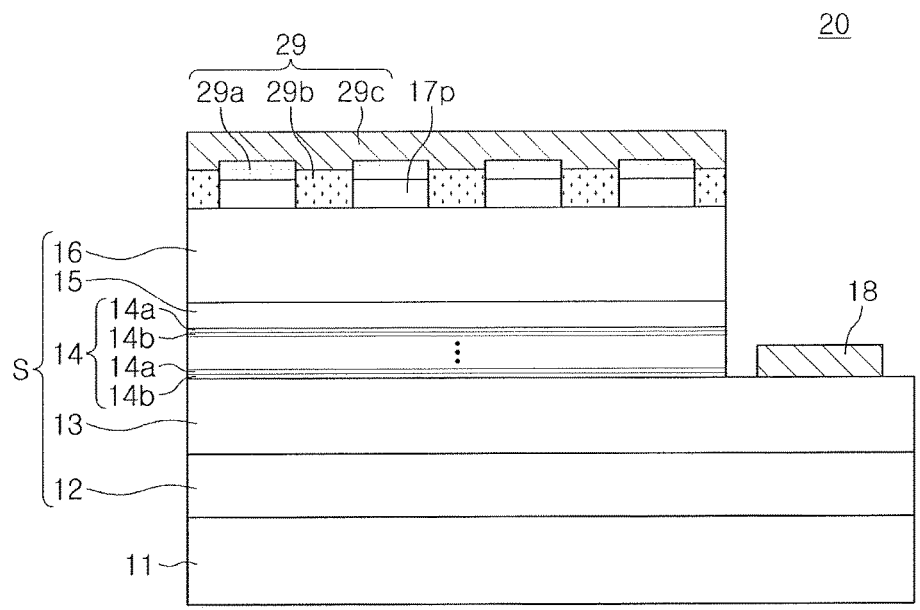
FIG. 7 illustrates a side cross-sectional view of an ultraviolet light emitting device according to an example embodiment.

FIG. 7 illustrates a side cross-sectional view of an ultraviolet light emitting device according to an example embodiment.

Referring to FIG. 7, it may be understood that an ultraviolet light emitting device 20 according to the embodiment is similar to the ultraviolet light emitting device 10 shown in FIGS. 1 and 2, with the exception that a second electrode 29 has a structure different from those shown in FIGS. 1 and 2, and the ultraviolet light emitting device 20 further includes an electron blocking layer 15. Descriptions of components of this embodiment may refer to the description of the same or similar components of the ultraviolet light emitting device 10 shown in FIGS. 1 and 2, unless otherwise specified.

The ultraviolet light emitting device 20 may include the electron blocking layer 15 disposed between the second conductivity-type semiconductor layer 16 and the active layer 14. The electron blocking layer 15 may be formed of a nitride semiconductor having an Al composition ratio that is greater than the Al composition ratio of the second conductivity-type semiconductor layer 16.

Similar to the previous embodiment, the second conductivity-type nitride patterns 17p may be partially (e.g., discontinuously) disposed on the second conductivity-type semiconductor layer 16. The transparent electrode layer 29a may be disposed on the upper surfaces (e.g., surfaces that face away from the second conductivity-type semiconductor layer 16) of the second conductivity-type nitride patterns 17p and may not be disposed in the region between the second conductivity-type nitride patterns 17p. A light-transmissive dielectric layer 29b may be formed on the upper surface of the second conductivity-type semiconductor layer 16 between the second conductivity-type nitride patterns 17p. The metal electrode 29c may be disposed on the transparent electrode layer 29a and the light-transmissive dielectric layer 29b. In the embodiment, unlike the previous embodiments, the transparent electrode layer 29a may not be formed in the region that provides the omnidirectional reflector.

FIG. 8A through FIG. 8E illustrate cross-sectional views of stages in a method of manufacturing the ultraviolet light emitting device illustrated in FIG. 7.

Figure 8A:
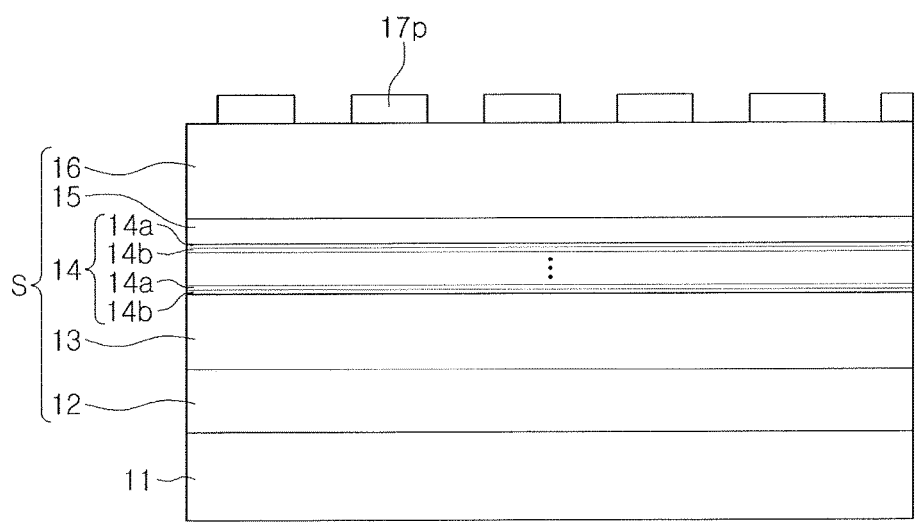
FIG. 8A through FIG. 8E illustrate cross-sectional views of stages in a method of manufacturing the ultraviolet light emitting device according to an example embodiment.

Referring to FIG. 8A, similarly to the embodiment shown in FIG. 6B, the second conductivity-type nitride layer 17 may be selectively etched to form the second conductivity-type nitride patterns 17p having a desired shape and arrangement.

The second conductivity-type nitride patterns 17p may only remain in some regions of the second conductivity-type semiconductor layer 16, and other regions of the second conductivity-type semiconductor layer 16 may be exposed to later form an omnidirectional reflector ODR. The process may be performed by a dry etching process such as an RIE process, similarly to the case of the previous embodiments.

Figure 8B:
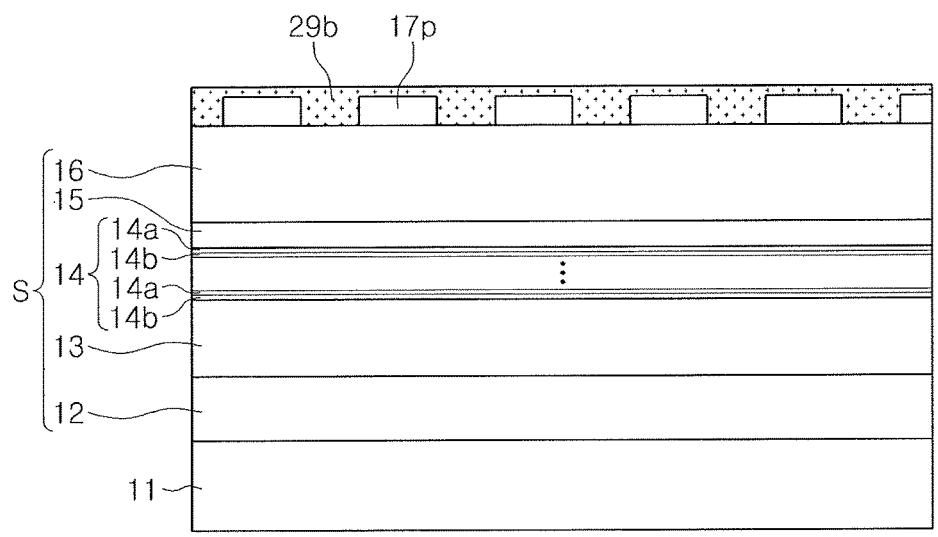
Figure 8C:
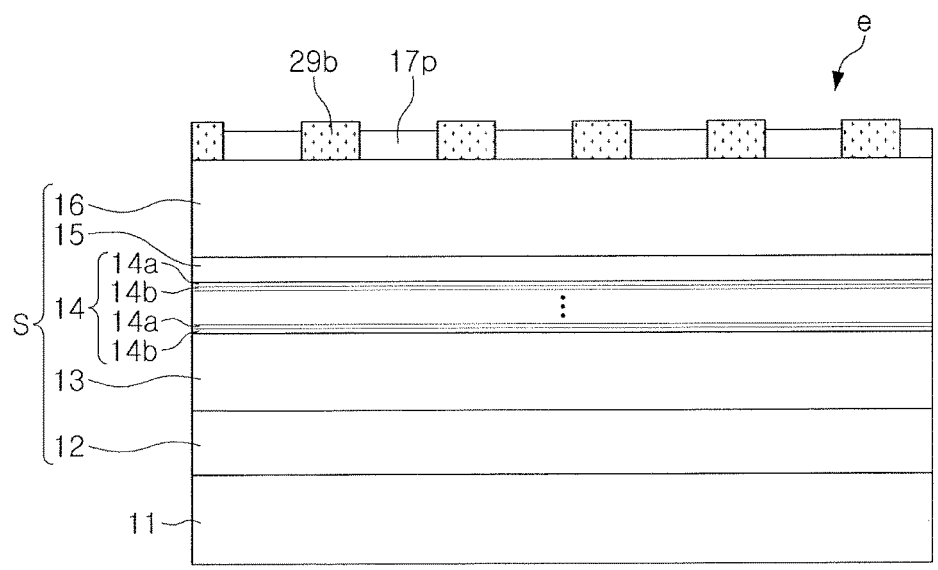

Next, as shown in FIG. 8B, the light-transmissive dielectric layer 29b may be formed so as to cover the second conductivity-type nitride patterns 17p on the second conductivity-type semiconductor layer 16 and the regions of the second conductivity-type semiconductor layer 16 between the second conductivity-type nitride patterns 17p. As shown in FIG. 8C, the light-transmissive dielectric layer 29b may be selectively etched to expose upper surface regions e of the second conductivity-type nitride patterns 17p.

The light-transmissive dielectric layer 29b may have a low refractive index (e.g., 2 or less). In an implementation, the light-transmissive dielectric layer 29b may include, e.g., $SiO_2$, SiN, $TiO_2$, HfO, or $MgF_2$. The exposed region e of the second conductivity-type nitride patterns 17p obtained after the selective etching of the light-transmissive dielectric layer 29b may be provided as a contact region with the transparent electrode layer 29a to be formed in the subsequent process.

Figure 8D:
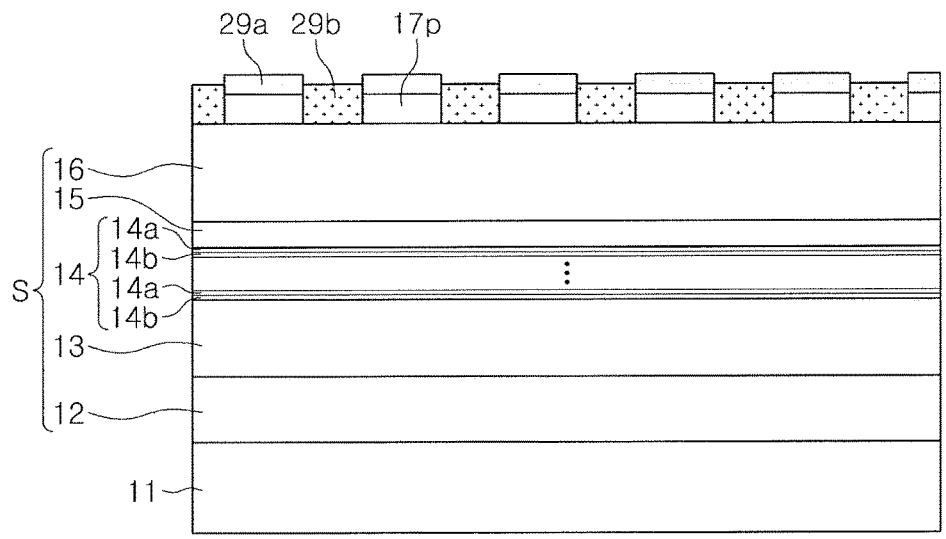
Figure 8E:
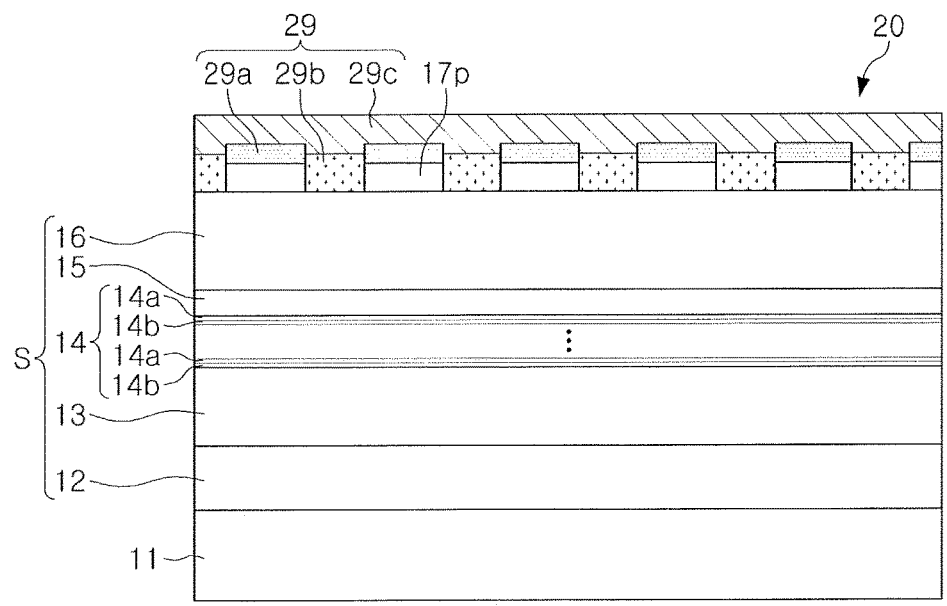

Next, as shown in FIG. 8D, the transparent electrode layer 29a may be formed on the exposed region of the second conductivity-type nitride pattern 17p. As shown in FIG. 8E, the metal electrode 29c may be formed on the transparent electrode layer 29a and on the light-transmissive dielectric layer 29b.

The transparent electrode layer 29a may be formed on the exposed region e of the second conductivity-type nitride patterns 17p by a selective deposition process using a mask. Then, the metal electrode 29c formed in the present process may be provided onto the transparent electrode layer 29a and the light-transmissive dielectric layer 29b to supply current to the transparent electrode layer 29a and at the same time, to combine with the light-transmissive dielectric layer 29b, thereby being provided as an omnidirectional reflector. In an implementation, the metal electrode 29c may include, e.g., Al, Rh, or Ru.

In an implementation, the respective processes may be variously modified. In an implementation, the transparent electrode layer 29a may be selectively deposited (see FIG. 8D) after selective etching of the light-transmissive dielectric layer 29b (see FIG. 8C). In an implementation, after forming the transparent electrode layer 29a on a nitride layer (before patterning, see FIG. 6A) for the second conductivity-type nitride patterns 17p, the transparent electrode layer 29a may be patterned simultaneously with a patterning process for forming the second conductivity-type nitride patterns 17p.

By way of summation and review, in the case of UV nitride semiconductor LEDs, the external quantum efficiency thereof could be degraded because of Auger recombination due to crystal defects and a low carrier concentration (e.g., in the case of holes), and they may be configured of highly refractive semiconductors, thereby resulting in low light extraction efficiency. For example, in the case of nitride semiconductor LEDs for a short-wavelength region (e.g., UV-B and UV-C) in an ultraviolet band, light extraction efficiency may be extremely low (e.g., 2% to 3%), and the commercialization of nitride semiconductor LEDs may be difficult. Meanwhile, nitride semiconductor layers having a wide band gap, e.g., AlGaN, may be used so as not to absorb ultraviolet light having a short wavelength therein, and it could be difficult to form an ohmic-contact with an electrode (e.g., a p-type electrode).

The ultraviolet light emitting devices according to the embodiments may help improve contact resistance by using the transparent electrode layer such as ITO, together with nitride patterns having a relatively small band gap, and at the same time, may help increase light extraction efficiency by providing an omnidirectional reflector with the use of the light-transmissive dielectric layer having a refractive index and the metal electrode. For example, the transparent electrode layer (such as ITO) may extend to a surface of the first conductivity-type semiconductor layer contacting the light-transmissive dielectric layer, and light efficiency may be significantly improved.

The embodiments may provide an ultraviolet light emitting device having an electrode structure capable of improving light extraction efficiency while allowing for formation of an excellent ohmic-contact.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. An ultraviolet light emitting device, comprising:
a first conductivity-type AlGaN semiconductor layer;
an active layer disposed on the first conductivity-type AlGaN semiconductor layer and having an AlGaN semiconductor;
a second conductivity-type AlGaN semiconductor layer disposed on the active layer and having an upper surface divided into a first region and a second region;
second conductivity-type nitride patterns disposed on the first region of the second conductivity-type AlGaN semiconductor layer and having an energy band gap that is smaller than an energy band gap of the second conductivity-type AlGaN semiconductor layer;
a transparent electrode layer covering the second conductivity-type nitride patterns and the second region of the second conductivity-type AlGaN semiconductor layer;
a light-transmissive dielectric layer disposed on the transparent electrode layer between the second conductivity-type nitride patterns; and
a metal electrode disposed on the transparent electrode layer overlying the second conductivity type nitride patterns and on the light-transmissive dielectric layer.

2. The ultraviolet light emitting device as claimed in claim 1, wherein the active layer is formed such that a plurality of quantum well layers formed of $Al_{x1}Ga_{1-x1}N$, in which $0<x1<1$, and a plurality of quantum barrier layers formed of $Al_{x2}Ga_{1-x2}N$, in which $x1<x2<1$, are alternately stacked.

3. The ultraviolet light emitting device as claimed in claim 1, wherein at least one of the first conductivity-type AlGaN semiconductor layer and the second conductivity-type AlGaN semiconductor layer has an energy band gap that is greater than an energy band gap of the AlGaN semiconductor of the active layer.

4. The ultraviolet light emitting device as claimed in claim 1, wherein the active layer is configured to emit light having a wavelength of 210 nm to 315 nm.

5. The ultraviolet light emitting device as claimed in claim 1, further comprising an electron blocking layer disposed between the second conductivity-type semiconductor layer and the active layer, the electron blocking layer being formed of an AlGaN semiconductor having an Al composition ratio that is greater than an Al composition ratio of the second conductivity-type AlGaN semiconductor layer.

6. The ultraviolet light emitting device as claimed in claim 1, wherein the second conductivity-type nitride patterns include a second conductivity-type GaN.

7. The ultraviolet light emitting device as claimed in claim 1, wherein the transparent electrode layer includes ITO, ZITO, ZIGO, GIO, ZTO, FTO, AZO, GZO, $In_4Sn_3O_{12}$, or $Zn_{(1-x)}Mg_xO$, in which $0 \leq x \leq 1$.

8. The ultraviolet light emitting device as claimed in claim 1, wherein:
the transparent electrode layer includes ITO, and
the transparent electrode layer has a thickness of 1 nm to 50 nm.

9. The ultraviolet light emitting device as claimed in claim 1, wherein the light-transmissive dielectric layer includes $SiO_2$, SiN, $TiO_2$, HfO, or $MgF_2$.

10. The ultraviolet light emitting device as claimed in claim 1, wherein the metal electrode includes Al, Rh, or Ru.

11. The ultraviolet light emitting device as claimed in claim 1, wherein the light-transmissive dielectric layer and the metal electrode constitute an omnidirectional reflector.

12. An ultraviolet light emitting device, comprising:
a light-emitting laminate including a first conductivity-type semiconductor layer including a $Al_{x1}Ga_{1-x1}N$ semiconductor, in which $0<x1<1$, a second conductivity-type semiconductor layer including a $Al_{x2}Ga_{1-x2}N$ semiconductor, in which $0<x2<1$, and an active layer disposed between the first and second conductivity-type semiconductor layers and including a $Al_{x3}Ga_{1-x3}N$ semiconductor, in which $0<x3<x1$ and $0<x3<x2$;
second conductivity-type nitride patterns partially disposed on the second conductivity-type semiconductor layer and including a $Al_{x4}Ga_{1-x4}N$ semiconductor, in which $0<x4<x2$;
a transparent electrode layer disposed on upper surfaces of the second conductivity-type nitride patterns;
a light-transmissive dielectric layer disposed on a region of the second conductivity-type semiconductor layer that is between the second conductivity-type nitride patterns; and
a metal electrode disposed on the transparent electrode layer and the light-transmissive dielectric layer.

13. The ultraviolet light emitting device as claimed in claim 12, wherein the transparent electrode layer extends onto the region of the second conductivity-type semiconductor layer between the second conductivity-type nitride patterns.

14. The ultraviolet light emitting device as claimed in claim 13, wherein:
the transparent electrode layer includes ITO, and
the transparent electrode layer has a thickness of 1 nm to 50 nm.

15. The ultraviolet light emitting device as claimed in claim 12, wherein the light-transmissive dielectric layer and the metal electrode constitute an omnidirectional reflector.

16. The ultraviolet light emitting device as claimed in claim 15, wherein:
the light-transmissive dielectric layer includes $SiO_2$, SiN, $TiO_2$, HfO, or $MgF_2$, and
the metal electrode includes Al, Rh, or Ru.

17. The ultraviolet light emitting device as claimed in claim 12, wherein:
an upper surface of the light-transmissive dielectric layer is farther from the second conductivity-type semiconductor layer than the upper surfaces of the second conductivity-type nitride patterns, and
the upper surface of the light-transmissive dielectric layer is closer to the second conductivity-type semiconductor layer than an upper surface of the transparent electrode layer.

18. The ultraviolet light emitting device as claimed in claim 12, wherein:
the transparent electrode layer includes ITO, and
the transparent electrode layer has a thickness of 1 nm or more.

19. The ultraviolet light emitting device as claimed in claim 12, wherein:
an Al composition ratio x2 of the second conductivity-type semiconductor layer is in a range of 0.40 to 1.0, and
an Al composition ratio x3 of the second conductivity-type nitride patterns is 0.2 or less.

20. An ultraviolet light emitting device, comprising:
a first conductivity-type AlGaN semiconductor layer;
an active layer disposed on the first conductivity-type AlGaN semiconductor layer and having an AlGaN semiconductor;
a second conductivity-type AlGaN semiconductor layer disposed on the active layer and having an upper surface divided into a first region and a second region;
second conductivity-type nitride patterns partially formed on the second conductivity-type semiconductor layer and including a GaN semiconductor;
an ITO layer disposed at least on upper surfaces of the second conductivity-type nitride patterns;
a light-transmissive dielectric layer disposed on the second conductivity-type semiconductor layer between the second conductivity-type nitride patterns; and
a metal electrode disposed on regions of the transparent electrode layer overlying the second conductivity type nitride patterns and on the light-transmissive dielectric layer.

* * * * *